(12) United States Patent
Li et al.

(10) Patent No.: US 12,274,186 B2
(45) Date of Patent: Apr. 8, 2025

(54) LOW CURRENT PHASE-CHANGE MEMORY DEVICE

(71) Applicant: International Business Machines Corporation, Armonk, NY (US)

(72) Inventors: Juntao Li, Cohoes, NY (US); Kangguo Cheng, Schenectady, NY (US); Ruilong Xie, Niskayuna, NY (US); Julien Frougier, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 343 days.

(21) Appl. No.: 17/805,707

(22) Filed: Jun. 7, 2022

(65) Prior Publication Data
US 2023/0397510 A1  Dec. 7, 2023

(51) Int. Cl.
*H10N 70/20* (2023.01)
*H10B 63/00* (2023.01)
*H10N 70/00* (2023.01)

(52) U.S. Cl.
CPC ............ *H10N 70/231* (2023.02); *H10B 63/80* (2023.02); *H10N 70/023* (2023.02);
(Continued)

(58) Field of Classification Search
CPC .. H10N 70/231; H10N 70/023; H10N 70/063; H10N 70/066; H10N 70/068;
(Continued)

(56) References Cited

U.S. PATENT DOCUMENTS 7,351,992 B2   4/2008  Scheuerlein
8,268,665 B2   9/2012  Hunks
(Continued)

FOREIGN PATENT DOCUMENTS

CN   101820048 A   9/2010

OTHER PUBLICATIONS

J. Y. Wu et al., "A low power phase change memory using thermally confined TaN/TIN bottom electrode," 2011 International Electron Devices Meeting, Washington, DC, USA, 2011, pp. 3.2.1-3.2.4 (Year: 2011).*

(Continued)

*Primary Examiner* — Khamdan N. Alrobaie
(74) *Attorney, Agent, or Firm* — Edward J. Wixted, III

(57) ABSTRACT

A semiconductor structure for a phase-change memory device includes a heater element on a portion of a bottom electrode in a first dielectric material. The semiconductor structure includes a layer of phase-change material that surrounds a portion of a second dielectric material, where the layer of phase-change material forms a three-dimensional shape around the portion of the second dielectric material. A conductive liner is under a first portion of the layer of phase-change material and surrounds a portion of a bottom surface of a hardmask layer and vertical portions of the hardmask layer. A conductive material is on a portion of a top surface of the second dielectric material and abuts the vertical portions of the layer of phase-change material below the conductive liner and the hardmask layer. A top electrode is on a top surface of the conductive material.

20 Claims, 8 Drawing Sheets

(52) U.S. Cl.
CPC ......... *H10N 70/063* (2023.02); *H10N 70/066* (2023.02); *H10N 70/068* (2023.02); *H10N 70/8413* (2023.02)

(58) Field of Classification Search
CPC ............. H10N 70/8413; H10N 70/823; H10N 70/8828; H10B 63/80
See application file for complete search history.

(56) References Cited

U.S. PATENT DOCUMENTS

| | | |
|---|---|---|
| 9,082,954 B2 | 7/2015 | Lung |
| 9,178,138 B2 | 11/2015 | Tan |
| 10,833,267 B2 | 11/2020 | Ok |
| 10,886,464 B2 | 1/2021 | Brightsky |
| 10,892,413 B2 | 1/2021 | Bruce |
| 11,038,106 B1 | 6/2021 | Radens |
| 2007/0096071 A1* | 5/2007 | Kordus, II ......... G11C 13/0004 257/E45.002 |
| 2007/0230238 A1* | 10/2007 | Schwerin ............. H10N 70/063 365/163 |
| 2020/0395537 A1* | 12/2020 | Ok ........................ H10N 70/861 |
| 2021/0050518 A1* | 2/2021 | Gong ................... H10N 70/063 |
| 2021/0296580 A1 | 9/2021 | Shen |
| 2021/0305503 A1 | 9/2021 | Philip |
| 2023/0189667 A1* | 6/2023 | Cheng ................. H10N 70/063 257/4 |

OTHER PUBLICATIONS

Wu et al., "Three Terminal Phase Change Memory With Self-Aligned Contacts", U.S. Appl. No. 17/473,359, filed Sep. 13, 2021, 32 pages.

\* cited by examiner

LOW CURRENT PHASE-CHANGE MEMORY DEVICE

BACKGROUND OF THE INVENTION

The present invention relates generally to the field of semiconductor device manufacture and more particularly to the formation of an integrated switch using stacked phase-change materials.

Phase-change materials include various chalcogenide glass materials that can be used in semiconductor device applications, such as phase-change random access memory (PCRAM) and radio frequency (RF) switches. A phase-change material typically has at least two solid phases, a crystalline state, and an amorphous state. The transformation between these two phases typically can be achieved by changing the temperature of the phase-change material above a transition temperature of the phase-change material using electrical heating or through optical pulses.

In the amorphous state, the phase-change material exhibits a higher resistivity than in the phase-change material in the crystalline state. In typical semiconductor switch applications, such as highly integrated radio frequency (RF) switches, when the phase-change material is in a low resistivity crystalline state, the switch is in an "ON" state and transmits signals, such as RF signals. Similarly, in typical semiconductor switch applications, when the phase-change material is in a highly resistive amorphous state, the switch is in an "OFF" state and does not transmit signals. A phase-change material, in a typical semiconductor application, may switch between numerous electrically detectable conditions of varying resistivities within a nanosecond time scale with the input of pico joules of energy. The optical and electronic properties can vary significantly between the amorphous and crystalline phases of the phase change material. In typical memory applications, switching from the high-resistance or "reset" state, where part or all of the phase change material is amorphous, occurs when a current pulse is applied that heats the amorphous material above the crystallization temperature for a sufficiently long time for the material to crystallize. The switch occurs because the threshold switching effect leads to a drastic and sudden (within nanoseconds) reduction of the resistance of the amorphous phase when a certain threshold field is surpassed, at a given threshold voltage. Switching from the low-resistance or "set" state, where the phase change material is crystalline, is achieved by a high current pulse with a very short trailing edge. In typical PCM semiconductor applications, the current pulse heats the material by Joule heating, melts it, and enables very fast cooling (melt-quenching) such that the phase change material solidifies in the amorphous state. Since a phase change material permits reversible phase transformation in a typical case of a PCRAM device, the memory bit status can be distinguished by determining the state of phase change material in the memory bit.

SUMMARY

Embodiments of the present invention provide a method of forming a semiconductor structure for a phase-change memory device. The semiconductor structure includes at least a heater element in a first dielectric material, where the heater element is on a portion of a bottom electrode. Embodiments of the present invention disclose a layer of phase-change material that surrounds a portion of a second dielectric material, where the layer of phase-change material forms a three-dimensional shape around the portion of the second dielectric material. The semiconductor structure includes a conductive liner under the phase-change material layer and surrounds a portion of a bottom surface of a hardmask layer and the vertical portions of the hardmask layer. Embodiments of the present invention include a conductive material on a portion of the top surface of the second dielectric material and abutting vertical portions of the layer of phase-change material below the conductive liner on the hardmask layer. The semiconductor structure includes a top electrode that is over the top surface of the conductive material and a portion of the hardmask layer. Embodiments of the present invention also include a semiconductor structure for a phase-change memory device where the phase-change material forms the three-dimensional shape around the portion of the second dielectric material but is on a layer of the resistive liner that is on the conductive liners.

Embodiments of the present invention provide a method of forming the semiconductor structure for a phase-change memory device that includes forming a heater element in a first dielectric material on a bottom electrode. The method includes depositing a second dielectric material and a hardmask layer over the heater element and the first dielectric material. The method includes patterning and etching the hardmask layer and the second dielectric layer that is followed by a lateral etching process to remove portions of the second dielectric material under the hardmask layer. The method includes conformally depositing a conductive liner over the semiconductor structure and directionally etching the conductive liner to remove the exposed horizontal portions of the conductive liner. The method includes conformally depositing a phase-change material over the semiconductor structure. A third dielectric material is deposited over the semiconductor structure followed by a chemical-mechanical polish that stops on the hardmask layer. A directional etching process recesses the third dielectric material and an isotropic etch back of the phase-change material is performed. A conductive material is deposited on the semiconductor structure followed by a chemical-mechanical polish. A top electrode is formed on the semiconductor structure.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
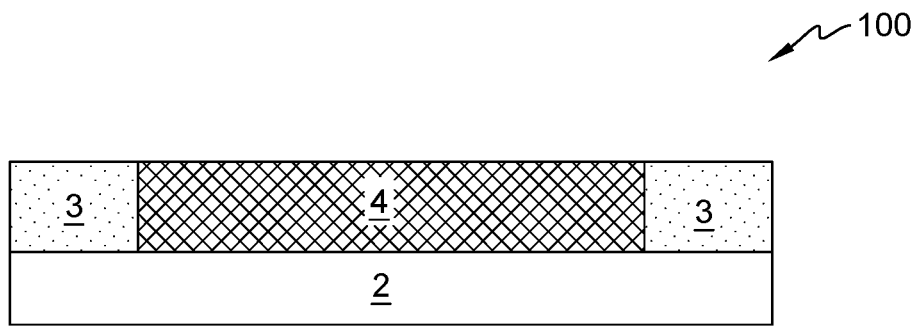
FIG. 1 depicts a cross-sectional view of a semiconductor structure after forming a bottom electrode on a semiconductor substrate in accordance with an embodiment of the present invention.

Embodiments of the present invention recognize that phase-change materials are increasingly used in semiconductor devices such as switches. Embodiments of the present invention recognize that directional etching processes, such as reactive ion etch (RIE), can damage the sidewalls of the phase-change material and thereby increase the electrical contact resistance between the phase-change material and any conductive material that contacts the damaged sidewalls of the phase-change material. The increased contact resistance between the phase-change material and a conductive material, such as a conductive liner, that carries the read current from the phase-change material to the top electrode of the PCM device would degrade PCM device performance.

Embodiments of the present invention recognize that improving the rate of phase transformations in the phase-change material would improve the phase-change memory (PCM) device performance. Embodiments of the present invention recognize that the ability for a faster state change in the PCM device is desirable, especially, to improve switching speeds in the semiconductor chip. Semiconductor structures that provide faster phase transformations within the phase-change material and that provide lower resistance paths for the read current would be desirable to improve PCM device functionality.

Embodiments of the present invention provide semiconductor structures for PCM devices and a method of forming the PCM semiconductor structures where the semiconductor structures provide both a lower resistance path for read currents and more efficient, easier phase transformations of the phase-change material. Embodiments of the present invention provide a semiconductor structure with improved electrical contact resistance between vertical edges of a conformally deposited phase-change material that is not directionally etched along the path of the read currents. More specifically, the surfaces of the conformally deposited phase-change material that directly contact the conductive liner carrying at least a portion of the read currents are not damaged by directional etching and therefore, provide lower electrical contact resistance with the conductive liner than conventionally formed PCM devices where directional etching of the phase-change material in contact with portions of the conductive liner are damaged causing higher electrical contact resistance with the conductive liner. Embodiments of the present invention provide a semiconductor structure for a PCM device with improved electrical contact resistance between the phase-change material and the conductive liner.

Conventionally formed PCM devices, such as pancake PCM devices with wider, thinner layers of the phase-change material, typically use directional etching processes to define the phase-change material shape. When using a directional etching process such as a reactive ion etching process in a conventionally formed PCM device, damage occurs to the exposed outer edges of the phase-change material. Embodiments of the present invention provide conformally deposited phase-change materials and conformally deposited conductive liner materials where the electrical contact resistance of the phase-change material with the conductive liner material is the same or uniform in each area where the phase-change material contacts the conductive liner. Embodiments of the present invention provide a conformally deposited and un-damaged layer of the phase-change material that provides a lower electrical contact resistance than portions of the conductive liner than a conventionally formed PCM device where a directional etch of the phase-change material damages some of the vertical surfaces of the phase-change material thereby increasing the electrical contact resistance of the damaged edges of phase-change material with the conductive liner. Embodiments of the present invention provide a PCM device where the contact resistance of phase-change material with the conductive liner carrying, at least a portion, of the read current, is not increased by damage occurring during a directional etch process.

Embodiments of the present invention also provide a semiconductor structure for a PCM device with a reduced phase-change material volume. Embodiments of the present invention provide a thin layer of a conformally deposited phase-change material on the heater element. Using a thin layer of the phase-change material creates a smaller volume of the phase-change material to be heated by the heater element thus reducing the time and/or energy needed to transition the high resistance amorphous phase or amorphous atomic structure of the phase material to the low resistance crystalline phase or crystalline atomic structure of the phase-change material. The small volume of the phase-change material over the heater element provides a faster phase transition in the phase-change material as less heating and/or cooling is required to transform the phase or state of the phase-change material (e.g., to change from the amorphous phase to the crystalline phase or vice-versa). In this way, embodiments of the present invention provide a PCM device with a semiconductor structure that allows faster transitions of the phase-change material and improves the functionality of the PCM device.

Embodiments of the present invention also provide semiconductor structures using a resistive liner to mitigate the effects of resistance drift occurring in the amorphous phase of the phase-change material.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Some of the process steps, depicted, can be combined as an integrated process step. In addition, descriptions of well-known functions and constructions may be omitted for clarity and conciseness.

The terms and words used in the following description and claims are not limited to the bibliographical meanings but are merely used to enable a clear and consistent understanding of the invention. Accordingly, it should be apparent to those skilled in the art that the following description of exemplary embodiments of the present invention is provided for illustration purposes only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" or "contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Deposition processes as used herein include but are not limited to chemical vapor deposition (CVD), plasma-enhanced chemical vapor deposition (PECVD), atomic layer deposition (ALD), ionized plasma vapor deposition (iPVD), plasma vapor deposition (PVD), gas cluster ion beam (GCIB) deposition, electroplating, but may not be limited these known semiconductor deposition processes.

Removing or etching as used herein may or may not include patterning using one of lithography, photolithography, an extreme ultraviolet (EUV) lithography process, or other known semiconductor patterning process that is followed by one or more of the etching processes. Various materials are referred to herein as being removed or "etched" where etching generally refers to one or more processes implementing the removal of one or more materials. In some cases, the removal of a material in an area occurs while leaving other protected areas of materials unaffected that are masked during the lithography processes. Some examples of etching processes include but are not limited to the following processes, such as a dry etching process using a reactive ion etch (RIE) or ion beam etch (IBE), a wet chemical etch process, or a combination of these etching processes. A dry etch may be performed using plasma. Plasma systems can operate in several modes by adjusting the parameters of the plasma. Ion milling, sputter etching, or reactive ion etching (RIE) bombards the wafer with energetic ions of noble gases that approach the wafer approximately from one direction, and therefore, these processes are anisotropic or a directional etching processes. Chemical mechanical planarization (CMP) is another known process of removing material using a combination of abrasive (polishing using an abrasive substance) and chemical processes to remove material from a top surface of a substrate.

Detailed embodiments of the claimed structures and methods are disclosed herein. The method steps described below do not form a complete process flow for manufacturing integrated circuits on semiconductor chips. The present embodiments can be practiced in conjunction with the integrated circuit fabrication techniques for semiconductor chips and devices currently used in the art, and only so many of the commonly practiced process steps are included as are necessary for an understanding of the described embodiments. The figures represent cross-section portions of a semiconductor chip or a substrate, such as a semiconductor wafer during fabrication, and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment," etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Reference will now be made in detail to the embodiments of the present invention, examples of which are illustrated in the accompanying drawings, wherein like reference numerals refer to like elements throughout.

FIG. 1 depicts a cross-sectional view of semiconductor structure 100 after forming bottom electrode 4 on substrate 2 in accordance with an embodiment of the present invention. As depicted, FIG. 1 includes substrate 2, dielectric 3, and bottom electrode 4.

Substrate 2 may be composed of any semiconductor substrate material. For example, substrate 2 can be composed of a silicon substrate, a group IV semiconductor material, a group III-V semiconductor material, a group II-VI semiconductor material, a silicon on insulator (SOI), or other known semiconductor material used in semiconductor chips. In some embodiments, substrate 2 is a silicon-on-insulator substrate. In various embodiments, substrate 2 is a wafer or a portion of a wafer. In various embodiments, substrate 2 includes one or more semiconductor devices. For example, substrate 2 may include transistors, isolation structures, contacts, or any other semiconductor device elements formed in a semiconductor wafer or semiconductor substrate.

Dielectric 3 resides on substrate 2. Dielectric 3 can be a layer of a dielectric material, deposited with known deposition processes. For example, dielectric layer 3 can be composed of one or more dielectric materials, including but not limited to silicon dioxide ($SiO_2$), silicon nitride (SiN), silicon carbide (SiC), silicon oxynitride (SiON), carbon-doped silicon oxide (SiO:C), fluorine-doped silicon oxide (SiO:F), silicon-carbon-nitride (SiCN), boron nitride (BN), silicon boron nitride (SiBN), silicoboron carbonitride (SiBCN), silicon oxycarbonitride (SiOCN), silicon oxide (SiO), boron carbon nitride (BCN), hydrogen silsesquioxane polymer (HSQ), methyl silsesquioxane polymer (MSQ), methyl doped silica ($SiO:(CH_3)$), organosilicate glass (Si-COH), porous SiCOH, or any another suitable dielectric material used in semiconductor device formation.

Bottom electrode 4 may be formed of any conductive material used in semiconductor chip electrodes. The bottom electrode 4 can be formed, for example, by a conventional complementary metal-oxide-semiconductor (CMOS) back-end-of-line (BEOL) damascene process (e.g., tungsten, cobalt, or copper surrounded by a low-k dielectric material). Bottom electrode 4 may have a rectangular shape or a round shape. Bottom electrode 4 is not limited to the size and shape depicted in FIG. 1 and may have numerous lengths, widths, and shapes in other examples. Bottom electrode 4 may be composed of but is not limited to, copper (Cu), titanium nitride (TiN), tungsten (W), tungsten nitride (WN), tungsten carbide (WC), silver (Ag), gold (Au), aluminum (Al) or multilayered stacks thereof. In various embodiments, bottom electrode 4 is a bit line. For example, bottom electrode 4 may be a bit line in a crossbar array of PCM devices that extends into and out of the drawing page.

Figure 2:
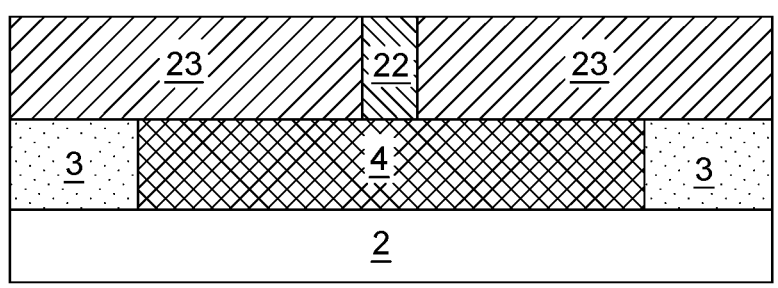
FIG. 2 depicts a cross-sectional view of the semiconductor structure after depositing a first dielectric material and forming a heater element in accordance with an embodiment of the present invention.

FIG. 2 depicts a cross-sectional view of semiconductor structure 200 after depositing dielectric material 23 and forming heater 22 in accordance with an embodiment of the present invention. As depicted, FIG. 2 includes the elements of FIG. 1 and dielectric material 23 and heater 22.

Dielectric material 23 is deposited with known deposition methods over dielectric 3 and bottom electrode 4. A typical thickness of dielectric material 23 can range between 20 and 40 nm but is not limited to these thicknesses. After depositing dielectric material 23, using lithography and dielectric etch processes, a via is formed over a portion of bottom electrode 4 for the heater element. Dielectric material 23 can be any suitable dielectric material such as SiN for a dielectric material surrounding a PCM heater element. After patterning the top surface of dielectric material 23, a via hole is etched contacting the top surface of bottom electrode 4. A typical width of the via hole can be 10 to 30 nm but is not limited to these widths.

Using a known deposition process such as chemical vapor deposition (CVD), physical vapor deposition (PVD), atomic layer deposition (ALD), metal-organic chemical vapor deposition (MOCVOD), plasma-enhanced chemical vapor deposition (PECVD), or the like, a conducting material is deposited in the via to form heater 22. The conducting material for heater 22 can a material such as but not limited to titanium nitride (TiN), tungsten (W), tantalum nitride (TaN), TiAl, or other similar resistive metal material which can provide joule heating to the phase-change material (not depicted in FIG. 2) in the completed PCM device. In one or more embodiments, heater 22 can include multiple different electrically conductive materials that can be arranged in multiple layers of materials (e.g., TaN/TiN/TaN). After filling the via with the conducting material, a CMP planarizes the top of semiconductor structure 200 and removes excess material for heater 22 from the top surface of dielectric material 23. Heater 22 can have a relatively small top surface area, which focuses the electrical current that is run through the phase-change material 82. This allows heater 22 to generate heat through resistive heating during a pulse of electricity, which can be used to selectively change the temperature of the phase-change material deposited on heater 22 in later process steps. Heater 22 with the relatively small top surface enhances the rate of temperature changes in the phase-change material deposited later, for example, by raising the phase-change material temperature above the phase-change temperature faster (e.g., above the crystallization temperature).

Figure 3:
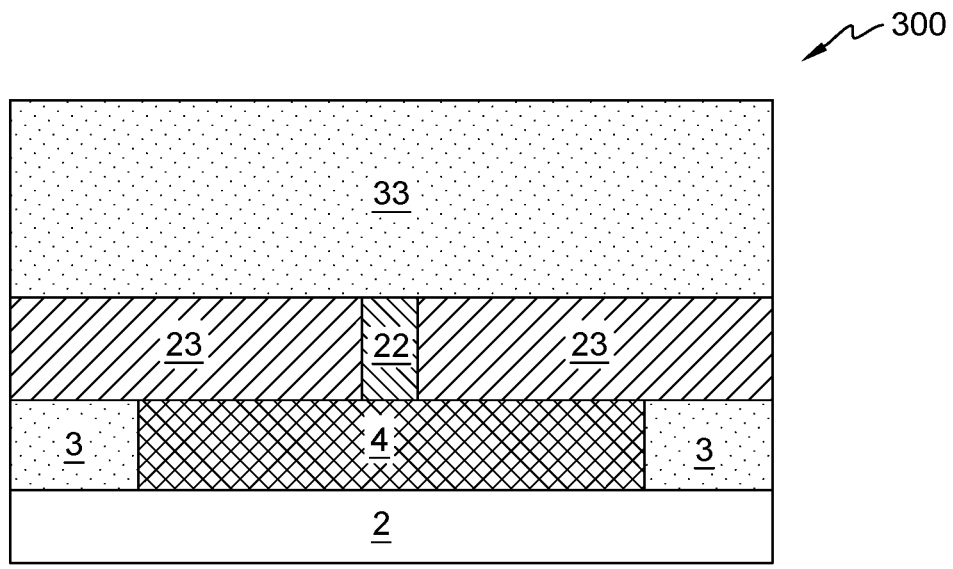
FIG. 3 depicts a cross-sectional view of the semiconductor structure after depositing a second dielectric material in accordance with an embodiment of the present invention.

FIG. 3 depicts a cross-sectional view of semiconductor structure 300 after depositing dielectric material 33 in accordance with an embodiment of the present invention. As depicted, FIG. 3 includes dielectric material 33 on heater 22 and dielectric material 23, bottom electrode 4, dielectric 3, and substrate 2. Deposited with known dielectric deposition processes, dielectric material 33 can be composed of $SiO_2$ or another suitable dielectric material for an interlayer dielectric in a PCM device.

Figure 4:
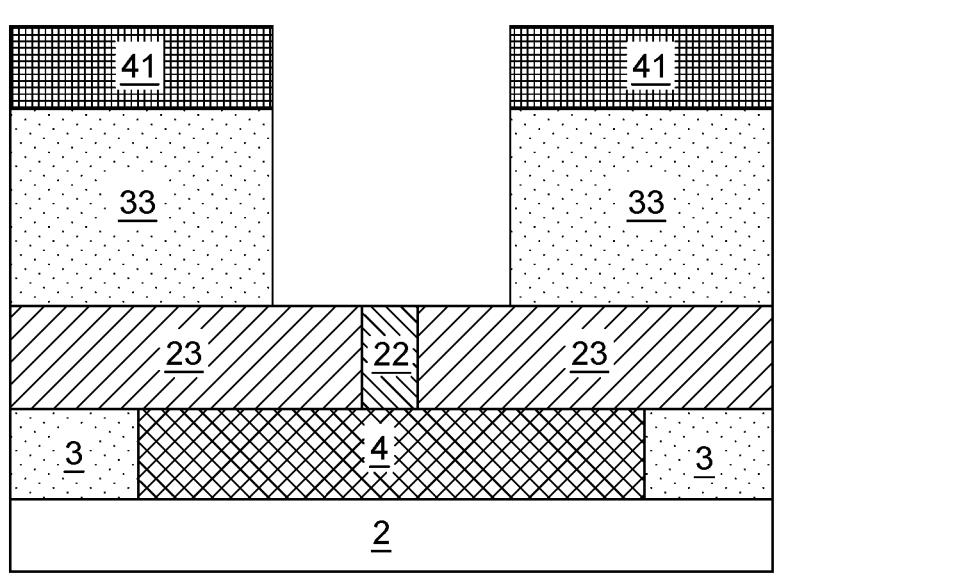
FIG. 4 depicts a cross-sectional view of the semiconductor structure after depositing and etching a hardmask material in accordance with an embodiment of the present invention.

FIG. 4 depicts a cross-sectional view of semiconductor structure 400 after depositing and etching hardmask 41 in accordance with an embodiment of the present invention. As depicted, FIG. 4 includes the elements of FIG. 3 and hardmask 41. A layer of a hardmask material such as but not limited to SiN is deposited over dielectric material 33. After the deposition of hardmask 41, hardmask 41 is patterned and portions of hardmask 41 and dielectric material 33 above heater 22 and a portion of dielectric material 23 can be removed. Typically, using conventional contact via hole patterning and etching processes, the shape of the hole created by removing a portion of hardmask 41 and a portion of dielectric material 33 may be a circle or an oval. The hole formed by the removal of portions of hardmask 41 and dielectric material 33 (e.g., using an ME) can typically form a circular hole or oval hole above heater 22 and dielectric material 23. In various embodiments, the diameter of the hole formed in dielectric material 33 is larger than heater 22. In an embodiment, the removed portion of hardmask 41 has approximately the same width as the width or diameter of heater 22. In this case, only a small or minimal portion of dielectric material 33 over dielectric material 23 is removed.

Figure 5:
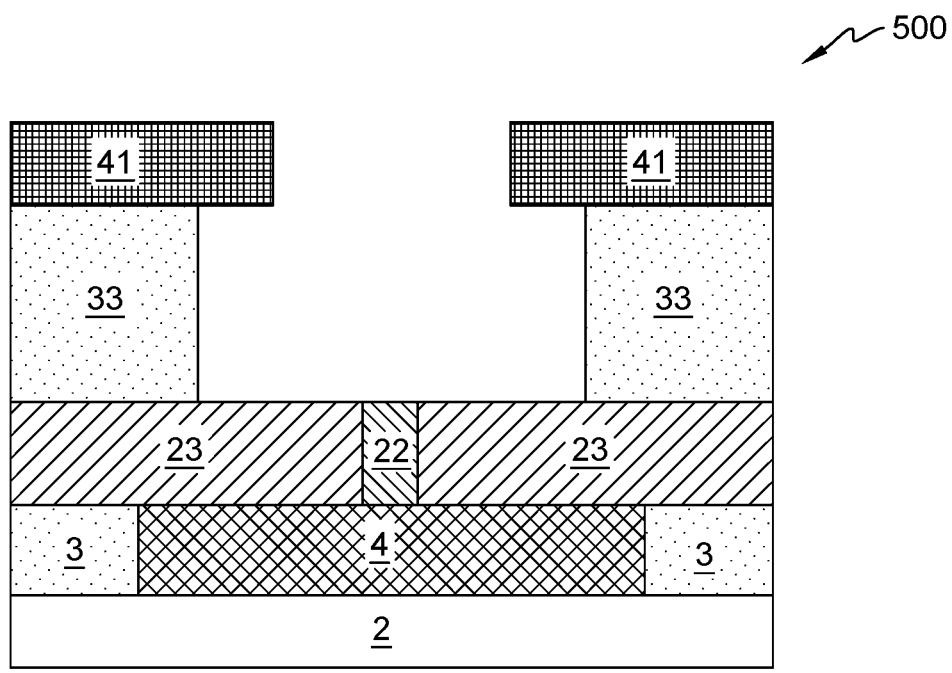
FIG. 5 depicts a cross-sectional view of the semiconductor structure after performing a lateral etch of the second dielectric material in accordance with an embodiment of the present invention.

FIG. 5 depicts a cross-sectional view of semiconductor structure 500 after performing a lateral etch of dielectric material 33 in accordance with an embodiment of the present invention. As depicted, FIG. 5 includes the elements of FIG. 4 without a portion of dielectric material 23 under a portion of hardmask 41. Using known lateral etching processes, a portion of dielectric material 23 is removed under hardmask 41 creating an overhang of hardmask 41 as depicted in FIG. 5. For example, 20 to 50 nm of hardmask 31 may extend beyond the vertical edges of dielectric material 23 but the extension or overhang of hardmask 41 beyond the remaining portion of dielectric material 33 is not limited to this range of distances. As depicted, the recess formed in dielectric material 33 is wider than the opening formed in hardmask 41.

Figure 6:
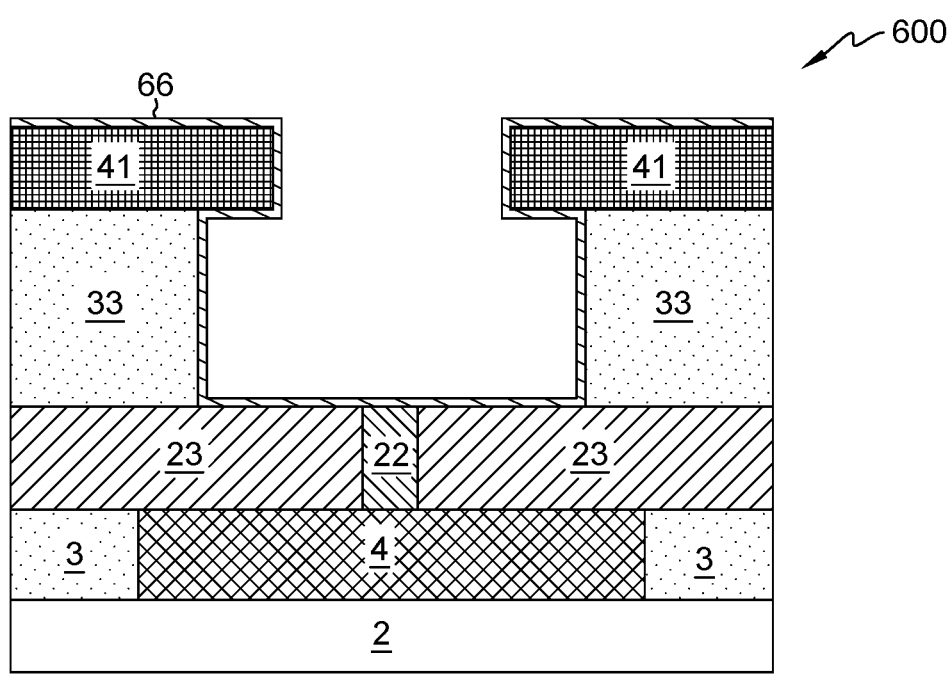
FIG. 6 depicts a cross-sectional view of the semiconductor structure after conformally depositing a conductive liner in accordance with an embodiment of the present invention.

FIG. 6 depicts a cross-sectional view of semiconductor structure 600 after conformally depositing liner 66 in accordance with an embodiment of the present invention. As depicted, FIG. 6 includes the elements of FIG. 5 and liner 66. Liner 66 may be composed of any electrically conductive material that will not react with the phase-change material deposited in a later process step. More specifically, the electrically conductive material for liner 66 does not react with the phase-change material deposited in FIG. 8 at elevated temperatures (e.g., above 650 deg. Celsius). Liner 66 may be composed of any conductive material used as a liner in contact with a phase-change material in a PCM device that is non-reactive with the phase change material at elevated temperatures. Liner 66 may conduct electrical signals or a portion of the electrical signals from bottom electrode 4 through the phase-change material to a top electrode of the completed PCM device. For example, liner 66 can be composed of TiN but is not limited to this material. Liner 66 can be deposited using a conformal deposition process such as but not limited to ALD or CVD. A typical thickness of liner 66 can be 3 to 8 nm but is not limited these thicknesses. The electrical resistivity of phase-change material deposited in later process steps (e.g., phase-change material 82) can be significantly higher than the electrical resistivity of conductive material forming liner 66. Liner 66 can have a lower electrical resistivity than the phase-change material deposited later when the phase-change material is in an amorphous phase or an amorphous state.

Figure 7:
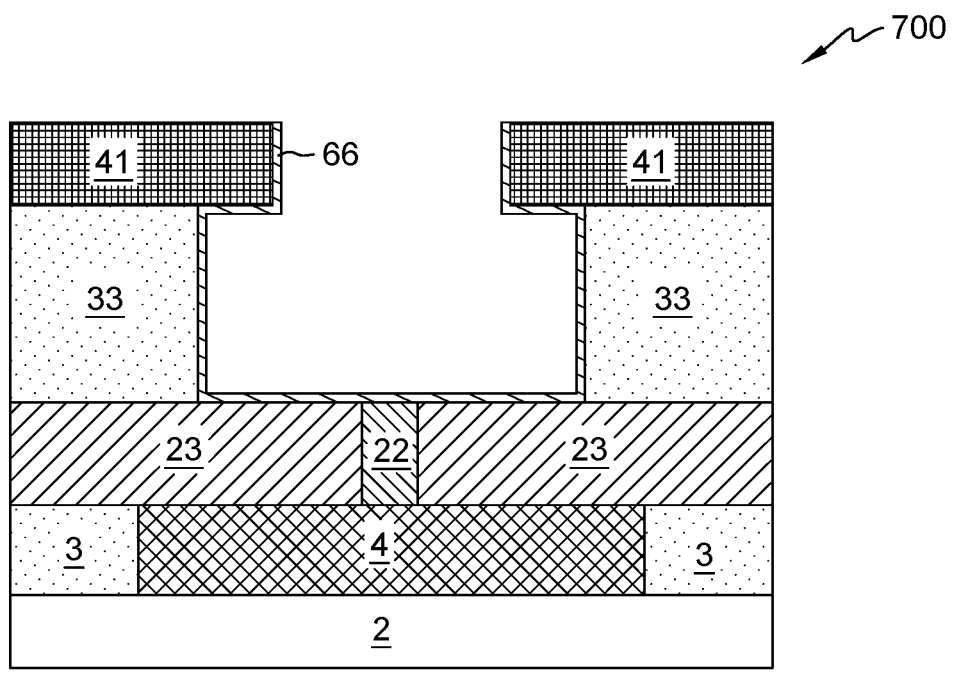
FIG. 7 depicts a cross-sectional view of the semiconductor structure after performing a directional etch to remove portions of the conductive liner in accordance with an embodiment of the present invention.

FIG. 7 depicts a cross-sectional view of semiconductor structure 700 after performing a directional etch to remove portions of liner 66 in accordance with an embodiment of the present invention. As depicted, FIG. 7 includes the elements of FIG. 6 without liner 66 above hardmask 41, above heater 22, and above a portion of dielectric material 23. A directional etching process, such as RIE can remove the exposed horizontal portions of liner 66. After the ME, the exposed portion of liner 66 on the top surface of hardmask 41, the portions of liner 66 above heater 22, and on the portion of dielectric material 23 that is not below the overhang of hardmask 41 are removed. In one embodiment, when the removed portion of hardmask 41 is approximately the same size and shape as heater 22, the removed portion of liner 66 is over heater 22 (e.g., the removed hardmask 41 is not over a portion of dielectric material 23). As depicted in FIG. 7, the top surface of heater 22 and a portion of the top surface of dielectric material 23 along with hardmask 41 are exposed.

As depicted in FIG. 7, after removing the exposed horizontal portions of the conductive material of liner 66, liner 66 remains on the exposed portions of dielectric material 23 and under a portion of hardmask 41. Liner 66 also remains on the vertical portions s of dielectric material 33 and vertical edges of hardmask 41. Liner 66 surrounds a three-dimensional opening composed of a wider portion on the bottom and a less wide portion of the opening adjacent to hardmask 41. The narrower top portion of the three-dimensional opening may be a rectangular opening, a round opening or hole, or an oval opening or hole in semiconductor structure 600 (when observed as a top view of semiconductor structure 600). As depicted in FIG. 7, the bottom portion of the opening above heater 22 and above a portion of dielectric material 23 is surrounded by liner 66 may be a larger rectangular opening than the top portion of the opening (e.g., the opening formed by two rectangular boxes or two circular openings of different sizes).

Figure 8:
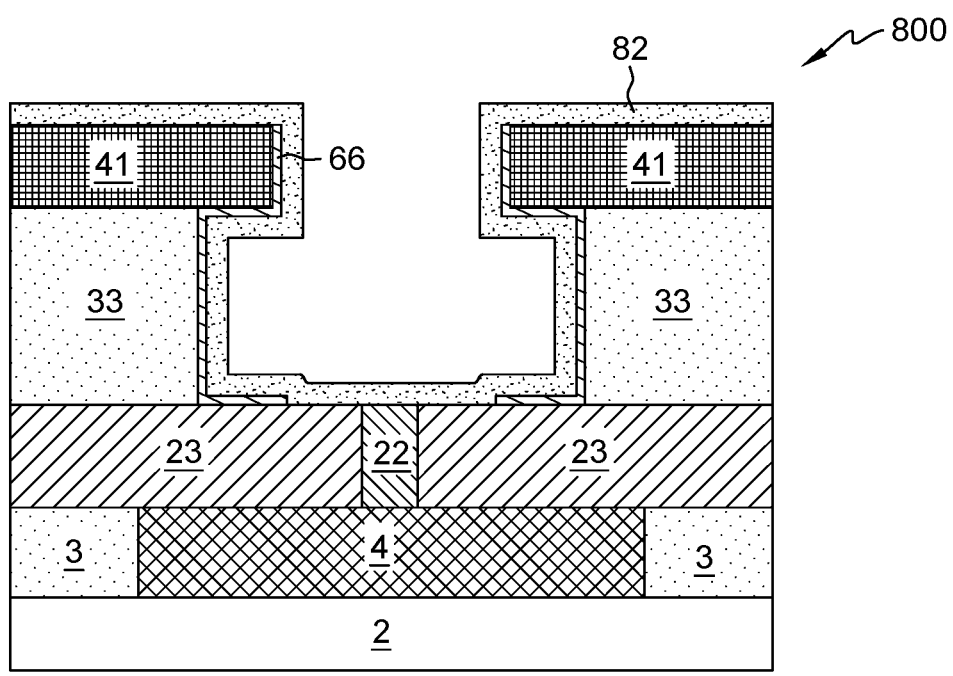
FIG. 8 depicts a cross-sectional view of the semiconductor structure after conformally depositing a layer of a phase-change material in accordance with an embodiment of the present invention.

FIG. 8 depicts a cross-sectional view of semiconductor structure 800 after conformally depositing phase-change material 82 in accordance with an embodiment of the present invention. As depicted, FIG. 8 includes the elements of FIG. 7 and phase-change material 82.

In various embodiments, a layer of a phase-change material 82 is conformally deposited on the surfaces of semiconductor structure 800. Phase-change material 82 may be composed of germanium-antimony-tellurium (GeSbTe also known as GST) or a germanium-tellurium compound material (GeTe), that is deposited over the exposed surfaces of hardmask 41, liner 66, dielectric material 23, and heater 22. Alternatively, other suitable materials for phase-change material 82 can include Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, Ge—Te alloys combinations thereof, or other phase-change material suitable for use in a PCM device. Phase-change material 82 may be undoped or doped (e.g., doped with one or more of O, N, Si, or Ti). A typical thickness of phase-change material 82 in semiconductor structure 800 can be 5 to 30 nm but is not limited to these thicknesses.

As previously discussed, the electrical resistivity of phase-change material 82 such as GST changes with changes in the atomic structure of phase-change material 82 (e.g., with a change of state of phase-change material 82 occurring at a phase change transition). Even in the lower electrical resistivity crystalline state, phase-change material 82 has a significantly higher electrical resistance than the conductive material of liner 66. For example, phase-change material 82 with a crystalline atomic structure can have an electrical resistivity that is eight to twelve times higher than the conductive material of liner 66.

Additionally, using the processes discussed above, phase-change material 82 is conformally deposited over liner 66, heater 22, a top surface of hardmask 41, and a portion of dielectric material 23 adjacent to heater 22. A bottom portion of phase-change material 82 is in direct contact with heater 22, a portion of dielectric material 23 adjacent to heater 22, and with a portion of liner 66 in the vicinity of heater 22. Using the previously discussed methods of forming semiconductor structure 800, phase-change material 82 is not directionally etched (e.g., vertical edges of phase-change material 82 contacting vertical edges of liner 66 are not damaged by a directional etch process). Semiconductor structure 800 provides a better electrical path (i.e., lower electrical resistance) between the vertical edge of liner 66 and the vertical edge of phase-change material 82 contacting liner 66 than typically provided in conventional PCM devices where the phase-change material is directionally etched. As previously discussed, in conventionally formed PCM devices, the phase-change material is typically etched, for example with RIE, damaging the outer edges of the phase-change material before depositing a conductive liner. In the conventionally formed PCM devices, the directional etching process, such as RIE, will increase electrical resistance between the conductive liner and the etched vertical surfaces of the phase-change material and reduce the electrical performance of the PCM device. Using the conformal deposition of phase-change material 82 on liner 66 and on the exposed vertical edges of liner 66 provides better electrical contact resistance than the contact of a liner with a directionally etched phase-change material.

After the conformal deposition of phase-change material 82, the layer of phase-change material 82 forms a three-dimensional shape around dielectric 93. Each of the sides of phase-change material 82 contacting liner 66 essentially have a uniform thickness and a uniform or the same electrical contact resistance with liner 66 (e.g., no damaged edges). In other words, the vertical edges of phase-change material 82 contacting the vertical edges of liner 66 in the bottom portion of liner 66 on dielectric material 23 are not damaged and do not have a lower electrical contact resistance with liner 66.

Figure 9:
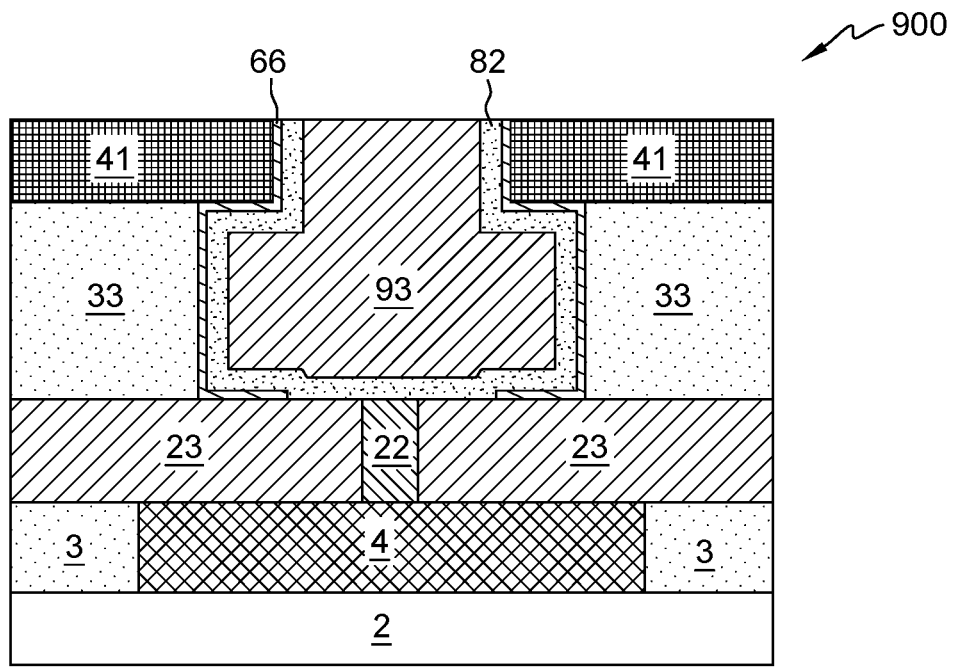
FIG. 9 depicts a cross-sectional view of the semiconductor structure after depositing a dielectric material and performing a chemical mechanical planarization (CMP) in accordance with an embodiment of the present invention.

FIG. 9 depicts a cross-sectional view of semiconductor structure 900 after depositing dielectric 93 and performing a CMP in accordance with an embodiment of the present invention. As depicted, FIG. 9 includes substrate 2, dielectric 3, heater 22, dielectric material 23, dielectric material 33, liner 66, phase-change material 82, and dielectric 93.

Dielectric 93 fills the recess or opening created during the etching of hardmask 41 and the lateral etch of dielectric material 33. A dielectric material such as SiN but not limited to SiN is conformally deposited as dielectric 93 to cover semiconductor structure 900 and fills the recess inside phase-change material 82. After the deposition, dielectric 93 is on hardmask 41 and covers phase-change material 82. The CMP removes dielectric 93 from the top surface of hardmask 41. After the CMP, dielectric 93 is surrounded by phase-change material 82 in semiconductor structure 900. As depicted in FIG. 9, dielectric 93 has a wider bottom portion adjacent to dielectric material 23 and a narrower cross-section adjacent to hardmask 41. Phase-change material 82 forms a three-dimensional shape around dielectric 93.

Figure 10:
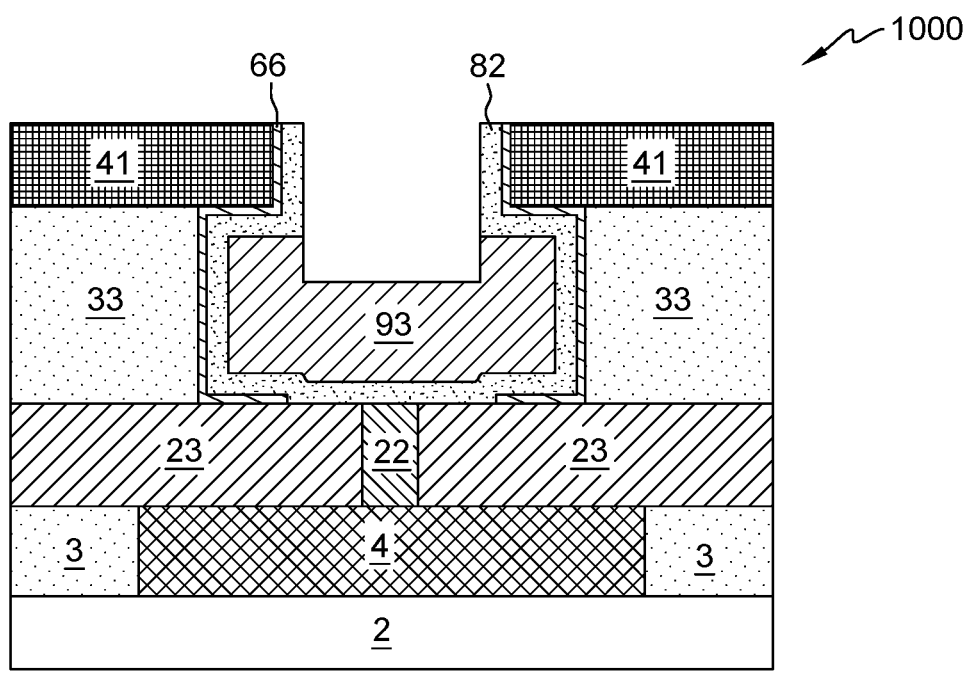
FIG. 10 depicts a cross-sectional view of the semiconductor structure after recessing the dielectric material in accordance with an embodiment of the present invention.

FIG. 10 depicts a cross-sectional view of semiconductor structure 1000 after recessing dielectric 93 in accordance with an embodiment of the present invention. As depicted, FIG. 10 includes the elements of FIG. 9 without a top portion of dielectric 93. Using a directional etching process (e.g., RIE), the top portion of dielectric 93 not under the top surface of phase-change material 82 is removed. As depicted, a portion of dielectric 93 adjacent to hardmask 41 and just below the bottom surface of hardmask 41 is removed (e.g., a rectangular portion of the top surface of dielectric 93 is removed).

Figure 11:
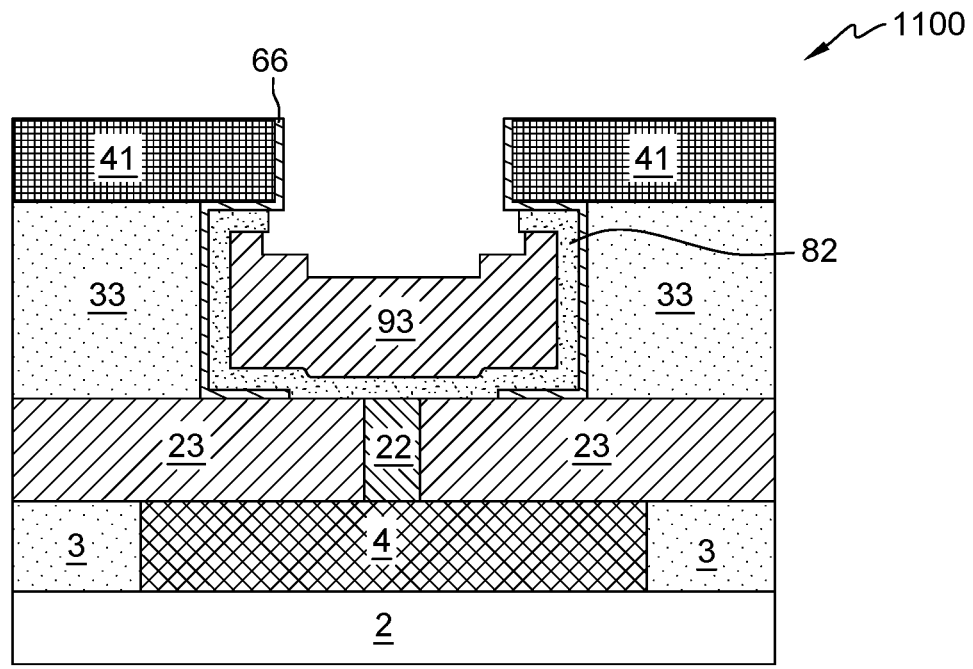
FIG. 11 depicts a cross-sectional view of the semiconductor structure after an etch back of the phase-change material in accordance with an embodiment of the present invention.

FIG. 11 depicts a cross-sectional view of semiconductor structure 1100 after an etch back of phase-change material 82 in accordance with an embodiment of the present invention. As depicted, FIG. 11 includes the elements of FIG. 10 without a top portion of phase-change material 82 on liner 66 adjacent to hardmask 41.

Using an isotropic etch process that can be a wet isotropic etch or a dry isotropic etch process such as a gaseous isotropic etching process, the portions of phase-change material 82 on liner 66 adjacent to the vertical edges of hardmask 41, and under a vertical portion of liner 66 and extending under a small portion under hardmask 41 can be removed. After the isotropic etch, an irregular-shaped opening in the cavity or recess can be formed. In FIG. 11, the completed irregularly shaped recess or opening formed after the isotropic etch includes a dip or lower region in dielectric 93, a horizontal wider opening adjacent to the vertical edges of phase-change material 82, and a narrower portion of the recess between the vertical edges of liner 66 on hardmask 41.

After phase-change material 82 etch back, phase-change material 82 surrounds a portion of liner 66 that is under hardmask 41, abutting dielectric material 33, on liner 66 on a portion of dielectric material 23, on dielectric material 23 adjacent to heater 22, and on heater 22. In semiconductor structure 1100, the remaining layer of phase-change material 82 essentially forms an irregularly shaped, three-dimensional layer with a uniform thickness. As viewed in the cross-sectional view depicted in FIG. 11, the remaining layer of phase-change material 82 has the shape of a sideways letter C with the opening of the letter C at the top and the center of the side of the letter C on heater 22 and a portion of dielectric material 23.

As depicted, phase-change material 82 remains on the horizontal portion of liner 66 on dielectric material 23, on the vertical portions of liner 66 on dielectric material 33 and on the horizontal portion of liner 66 under hardmask 41. The inside surfaces of the letter C created by the remaining phase-change material 82 surround the remaining dielectric 93 which has a stepped top surface (i.e., a higher top surface of dielectric 93 adjacent to phase-change material 82 and a lower top surface in the center portion of dielectric 93).

Figure 12:
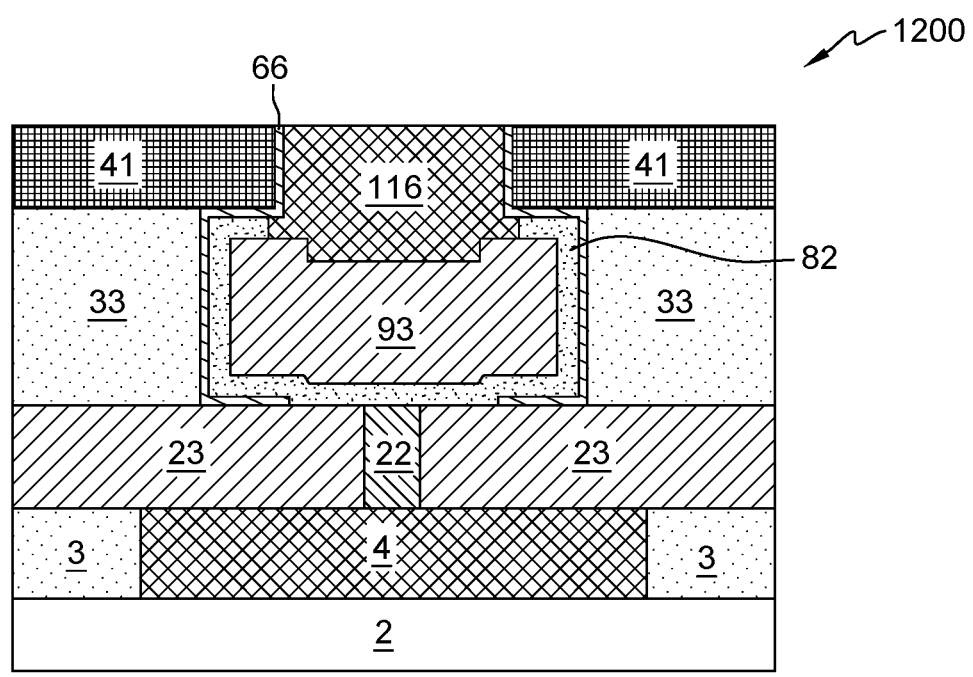
FIG. 12 depicts a cross-sectional view of the semiconductor structure after depositing a conductive material and performing a CMP in accordance with an embodiment of the present invention.

FIG. 12 depicts a cross-sectional view of semiconductor structure 1200 after depositing conductive material 116 and performing a CMP in accordance with an embodiment of the present invention. As depicted, FIG. 12 includes the elements of FIG. 11 and conductive material 116.

Conductive material 116 fills the recess or cavity created in semiconductor structure 1100 and covers the top surface of hardmask 41. Conductive material 116 can be tungsten (W), aluminum (Al), copper (Cu), cobalt (Co), nickel (Ni), titanium (Ti), ruthenium (Ru), molybdenum (Mo), or any other suitable conductive material. The metal contact can further include a barrier layer (not shown). The barrier layer can be TiN, TaN, HfN, NbN, WN, WCN, or combinations thereof. In various embodiments, the barrier layer can be deposited in the trench(es) by ALD, CVD, MOCVD, PECVD, or combinations thereof. In various embodiments, the conductive material 116 is deposited on hardmask 41, and exposed edge of phase-change material 82, and exposed portions of dielectric 93. For example, conductive material 116 can be deposited by ALD, CVD, PVD, and/or another deposition processes. As depicted in FIG. 12, conductive material 116 has a lower bottom surface in a center portion of the bottom surface of conductive material 116. After the deposition, a CMP removes conductive material 116 from the top surface of hardmask 41.

Figure 13:
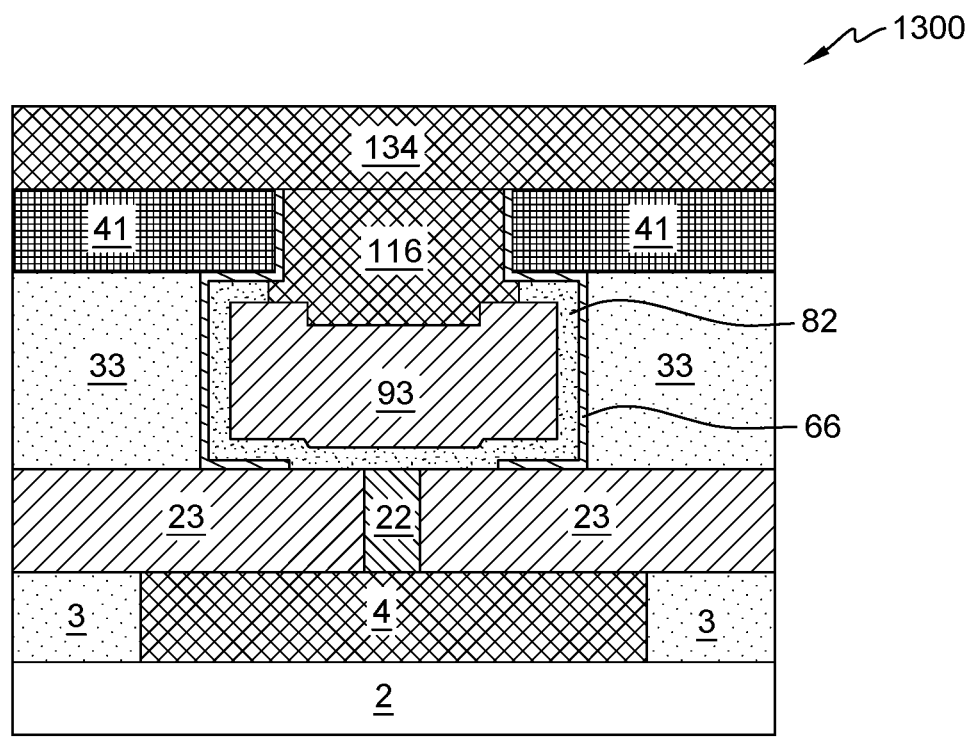
FIG. 13 depicts a cross-sectional view of the semiconductor structure after forming a top electrode in accordance with an embodiment of the present invention.

FIG. 13 depicts a cross-sectional view of semiconductor structure 1300 after forming top electrode 134 in accordance with an embodiment of the present invention. As depicted, FIG. 13 includes top electrode 134, hardmask 41, liner 66, conductive material 116, phase-change material 82, dielectric material 33, heater 22, dielectric material 23, heater 22, dielectric 3, bottom electrode 4, and substrate 2 where substrate 2 may include one or more semiconductor elements or devices. As depicted, the width of the portion of conductive material 116 and liner 66 contacting the bottom surface of top electrode 134 is less than the width of dielectric 93. As depicted, the width of liner 66 and conductive material 116 contacting top electrode 134 is essentially the same as the width of phase-change material 82 contacting heater 22 and dielectric material 23. In an embodiment, the portion of conductive material 116 and liner 66 contacting top electrode 134 is the same width as the portion of phase-change material 82 contacting heater 22.

Top electrode 134 can be any conductive material or metal used as an electrode in semiconductor devices. For example, top electrode 134 can be composed of W, TiN, Cu, etc. As depicted, a layer of electrically conductive material (e.g., W, Cu, etc.) is deposited on hardmask 41 and conductive material 116 for top electrode 134. As known to one skilled in the art, the layer of material for top electrode 134 can be patterned and etched to any size and shape that covers at least a portion of conductive material 116 and preferably, covers conductive material 116. In various embodiments, top electrode 134 is a word line in a crossbar array of PCM devices. For example, top electrode 4 as a word line may extend in the crossbar array to the right and left sides of the PCM device formed with semiconductor structure 1300.

As depicted in FIG. 13, semiconductor structure 1300 includes heater 22 in dielectric material 23 that is on a portion of a bottom electrode 4. A layer of phase-change material 82 surrounds a portion of dielectric 93. As depicted, the layer of phase-change material 82 forms a three-dimensional shape around portions of dielectric 93. The layer of phase-change material 82, as depicted in FIG. 13, is over a portion of the top surface of dielectric 93, on the vertical sides of dielectric 93, and on the bottom surfaces of dielectric 93. Liner 66 is under a portion of the layer of phase-change material 82 that on a portion of the top surface of dielectric material 23 adjacent to heater 22, on the vertical sides of dielectric material 33, surrounds a portion of the bottom surface of hardmask 41 and the vertical sides of hardmask 41.

The three-dimensional shape of the layer of phase-change material 82 includes a horizontal portion of phase-change material 82 on heater 22 and on a portion of dielectric material 23 adjacent to heater 22 and another horizontal portion of phase-change material 82 that is under a portion of liner 66 that surrounds a portion of the bottom surface of hardmask 41, The three-dimensional shape of the layer of phase-change material 82 also includes a vertical portion of phase-change material 82 that is on a vertical portion of liner 66 residing on the vertical sides of dielectric material 33.

In various embodiments, the PCM device formed with semiconductor structure 1300 is capable of being switched between a first atomic structural state in which the material is in a generally amorphous solid phase and a second atomic structural state in which the material is in a generally crystalline solid phase in the active region of the PCM cell. The active region of the PCM, in various embodiments, is the portion of phase-change material 82 above and adjacent to heater 22. The term "amorphous" is used to refer to a relatively less ordered structure, more disordered than a single crystal, which has detectable characteristics such as higher electrical resistivity than the crystalline phase. The term "crystalline" is used to refer to a relatively more ordered structure, more ordered than in an amorphous structure, which has detectable characteristics such as lower electrical resistivity than the amorphous phase. The change from the amorphous to the crystalline state referred to as "SET" in PCM devices is generally a lower current operation, requiring a current that is sufficient to raise phase-change material 82 to a level between a phase transition temperature and a melting temperature. The change from crystalline to amorphous referred to as "RESET," is generally a higher current operation, which includes a short high current density pulse to melt or break down the crystalline structure, after which phase-change material 82 cools quickly, quenching the phase change process, thus allowing at least a portion of the phase change structure to stabilize in the amorphous state. Since phase-change material 82 permits reversible phase transformation in a typical case of a PCM device also known as a PCRAM device, the memory bit status can be distinguished by determining the state of phase-change material 82 in the memory bit. For example, the large resistance contrast between SET and RESET state can be used to store information in PCM device (the high-resistance state can represent a logical "0" while the low-resistance state can represent a logical "1").

The PCM device of semiconductor structure 1300 provides a small volume of phase-change material 82 over heater 22. With a volume of phase-change material 82 that is smaller than conventional PCM device structure, semiconductor structure 1300 provides a PCM device that is more easily switched (e.g., phase-change material 82 with less volume may be heated faster with less thermal energy from heater 22 to initiate a phase-change). The thin layer of phase-change material 82 over heater 22 can be heated to the material transition temperature more easily and phase-change material 82 can be changed from the amorphous atomic structure to a crystalline atomic structure with less energy and/or less time. In other words, using a smaller volume of phase-change material 82 allows phase-change material 82 to attain the transition temperature faster or quickly so that the PCM device depicted in semiconductor structure 1300 can be changed to an "SET" state more quickly than a conventional mushroom PCM device formed with a thicker layer of a phase-change material.

As previously discussed, liner 66 has a significantly lower electrical resistivity than phase-change material 82 in the crystalline phase and therefore, in the "ON" state the signal will go through liner 66 to top electrode 134. Phase-change material 82 is deposited as a thin layer on liner 66 and provides both a small volume of phase-change material 82 above heater 22 to be heated and transitioned to a crystalline structure but also, creates an undamaged interface between phase-change material 82 and liner 66.

As previously discussed, conventional pancake PCM device structures can be formed from sequentially deposited layers of a phase-change material, a dielectric material, and a top electrode that are deposited over a heater element. The layers are patterned and directionally etched to form a low pillar or platform of phase-change material, dielectric material, and top electrode where the outer edges of the phase-change material have been damaged by the directional etching process. The liner material can be deposited over the damaged outer edges of the phase-change material which can increase the electrical resistance of the interface between the liner and the phase-change material when compared to the interface electrical resistance between phase-change material 82 and liner 66 in semiconductor structure 1300.

Conformally depositing phase-change material 82 directly on liner 66 provides improved electrical performance of semiconductor structure 1300 compared to conventionally formed PCM devices where portions of the phase-change material are removed using directional etching, such as RIE, that damages the sides of the phase-change material in contact with the conductive liner. In semiconductor structure 1300, phase-change material 82 retains the as deposited atomic structure in all portions of phase-change material 82 in contact with liner 66. For example, the portions of phase-change material 82 contacting liner 66 adjacent to heater 22 are not damaged by directional etching process and retain the as deposited phase-change material 82 structure that provides better electrical performance for the PCM device of semiconductor structure 1300.

Figure 14:
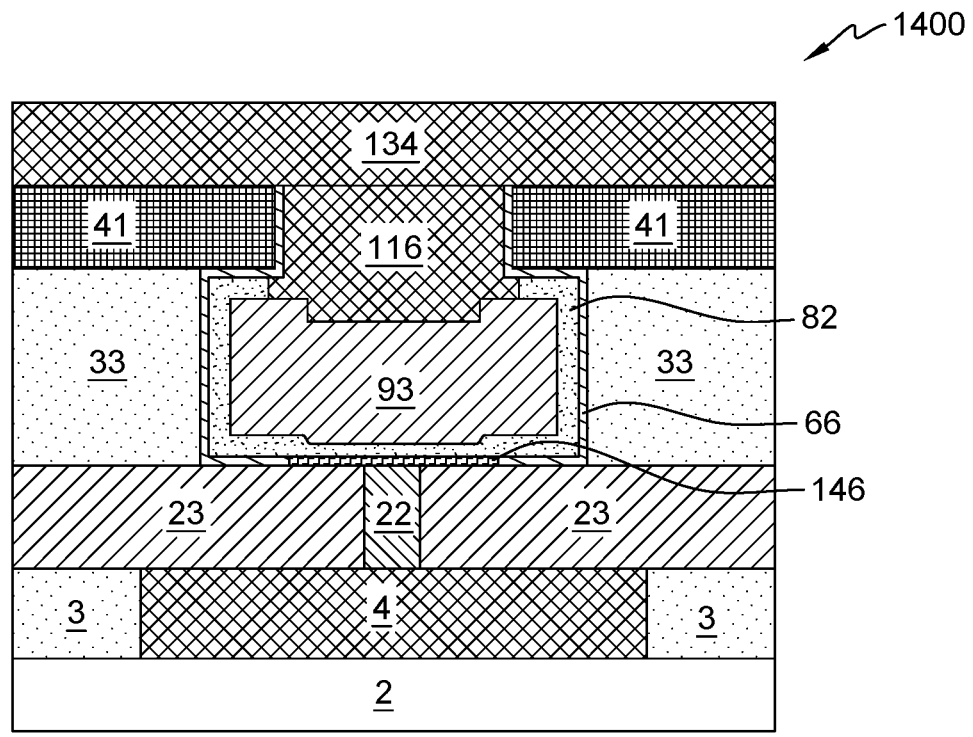
FIG. 14 depicts a cross-sectional view of a semiconductor structure with a resistive liner above the heater element and portions of the first dielectric material in accordance with a second embodiment of the present invention.

FIG. 14 depicts a cross-sectional view of semiconductor structure 1400 with resistive liner 146 above heater 22 and portions of dielectric material 23 in accordance with a second embodiment of the present invention. As depicted, FIG. 14 includes the elements of FIG. 13 and resistive liner 146 between a bottom portion of phase-change material 82, heater 22, and portions of dielectric material 23. In some embodiments, resistive liner 146 is deposited before phase-change material 82, for example, using a selective or directional deposition process (e.g., ALD) after the directional etch of FIG. 7. In various embodiments, resistive liner 146 is on heater 22, a portion of dielectric material 23, and abuts the vertical edge of liner 66 adjacent to heater 22. In one embodiment, resistive liner 146 is on heater 22.

Resistive liner 146 can be formed by a thin layer of a higher resistivity material than the phase-change material 82. For example, resistive liner 146 can be composed of tantalum nitride (TaN). Resistive liner 146 can also be composed of other conductive materials such as, for example, aluminum nitride (AlN), boron nitride (BN), aluminum oxide (AlO), TaN, W, tungsten nitride (WN), cobalt tungsten (CoW), nickel tungsten (NiW), yttrium oxide (YO), or alloys of these materials. The electrical resistance of resistive liner 146 is substantially greater than the resistance of phase-change material 82 in low resistance state or crystalline phase (e.g., ten to thirty or more times higher) and substantially lower than the resistance of phase-change material 82 in high resistance state (e.g., five to twenty or more times lower). Resistive liner 146 can be deposited a couple nanometers to ten nanometers thick in order to improve electrical function, such as mitigating resistance drift in the completed device. As known to one skilled in the art, the amorphous state of phase-change material 82 can exhibit a resistance drift over time and when resistive liner 146 is not present, the read current passes through the amorphous phase-change material 82 which may have a changing electrical resistance that adversely affects PCM device performance. The resistive liner 146, for example, can migrate resistance drift. The resistance drift is mitigated by the resistive liner as the resistive liner shunts read current in the amorphous PCM. With resistive liner 146, in the set process of the PCM device of semiconductor structure 1400, the read current will pass through resistive liner 146, the crystalline phase-change material depending on the size of the amorphous material on top of the heater 22 and liner 66 rather than passing through switched region (amorphous phase) in phase-change material 82 in semiconductor structure 1300 of FIG. 13.

Similar to semiconductor structure 1300, semiconductor structure 1400 includes the layer of phase-change material 82 with the three-dimensional structure that includes a small overhang under a portion of liner 66 that is under hardmask 41. The conformally deposited and etched back phase-change material 82 lines the inside bottom wider portion of a three-dimensional cavity and surrounds dielectric 93 filling the three-dimensional cavity. A neck or thinner top portion of the cavity includes liner 66 on hardmask 41 and can be filled with a conductive material 116. The threes-sided structure or cavity covered with the layer of phase-change material 82 includes phase-change material 82 on the horizontal portion on resistive liner 146, on a horizontal portion of liner 66 above dielectric material 23, on vertical portions of liner 66 on dielectric material 33, and on a small horizontal portion on liner 66 under a portion of hardmask 41.

Figure 15:
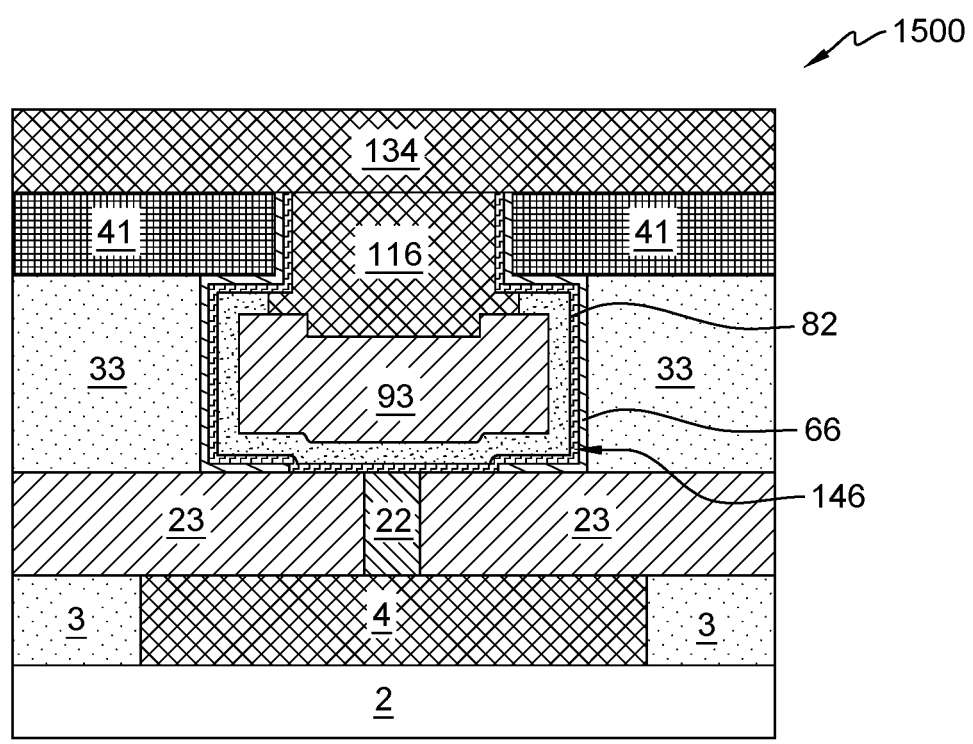
FIG. 15 depicts a cross-sectional view of the semiconductor structure with a resistive liner on the heater element, the portions of the first dielectric material, and the conductive liner in accordance with a third embodiment of the present invention.

FIG. 15 depicts a cross-sectional view of semiconductor structure 1500 with resistive liner 146 on heater 22, the portions of dielectric material 23 adjacent to heater 22, and on liner 66 in accordance with a third embodiment of the present invention. As depicted, FIG. 15 includes the elements of FIG. 14 but with resistive liner 146 under phase-change material 82 and extending up above phase-change material 82 on liner 66 adjacent to conductive material 116 to contact top electrode 134.

In semiconductor structure 1500, using a known conformal deposition process (e.g., ALD), resistive liner 146 is deposited on liner 66, heater 22, and a portion of dielectric material 23 adjacent to heater 22 after selectively removing the portion of liner 66 over heater 22 and the portion of dielectric material 23. The material and thickness of resistive liner 146 can be the same materials and thicknesses as discussed above. Similar to semiconductor structure 1400, semiconductor structure 1500 also mitigates the effect of the resistance drift of phase-change material 82 in the amorphous state or high resistance phase of the atomic structure of phase-change material 82. Semiconductor structure 1500 provides functional benefit to the performance of the PCM device that is formed using a different (e.g., conformal deposition process) than conventional PCM devices, as previously discussed.

As depicted in FIG. 15, phase-change material 82 has a similar shape as a tipped or sideways letter C with the opening of the letter C similar to semiconductor structures 1300 and 1400. The opening of the C-shaped layer of phase-change material 82 faces the top surface of semiconductor structure 1500. In semiconductor structure 1500, the layer of phase-change material 82 with an essentially uniform thickness forms an irregular, three-dimensional shape on resistive liner 146. Phase-change material 82 surrounds dielectric 93 and abuts a bottom portion of conductive material 116 in a recess that is below a portion of hardmask 41 (e.g., similar to semiconductor structure 1300 but deposited on resistive liner 146). In FIG. 15, resistive liner 146 is under phase-change material 82 and above liner 66.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A semiconductor structure for a phase-change memory device, the semiconductor structure comprising:
   a heater element in a first dielectric material, wherein the heater element is on a portion of a bottom electrode;
   a layer of phase-change material surrounds a portion of a second dielectric material; and
   a conductive liner is on a first portion of the first dielectric material, under a first portion of the layer of phase-change material, and surrounds a portion of a bottom surface of a hardmask layer and vertical portions of the hardmask layer.

2. The semiconductor structure of claim 1, further comprising:
a conductive material on a portion of a top surface of the second dielectric material and abuts vertical portions of the conductive liner on the vertical portions of the hardmask layer and a vertical portion of the layer of phase-change material under a portion of the conductive liner that surrounds the portion of the bottom surface of the hardmask layer, wherein the conductive material has a lower bottom surface in a center portion of the conductive material; and
a top electrode is on at least a exposed top surface of the conductive material and the conductive liner.

3. The semiconductor structure of claim 1, wherein the layer of phase-change material surrounds the portion of the second dielectric material forms a three-dimensional shape.

4. The semiconductor structure of claim 3, further comprises:
a first horizontal portion of the layer of phase-change material is on the heater element and on a second portion of the first dielectric material, wherein a vertical edge of the first horizontal portion of the layer of phase-change material on the second portion of the first dielectric material abuts a vertical edge of the conductive liner on the first portion of the first dielectric material;
a second horizontal portion of the layer of phase-change material is a bottom portion of the conductive liner on the first portion of the first dielectric material;
a third horizontal portion of the layer of phase-change material is under a top portion of the conductive liner, wherein the top portion of the conductive liner is under the portion of the bottom surface of the hardmask layer; and
a vertical portion of the layer of phase-change material on a vertical portion of the conductive liner residing on vertical sides of a third dielectric material.

5. The semiconductor structure of claim 1, wherein the layer of phase-change material surrounds the portion of a second dielectric material has a uniform thickness.

6. The semiconductor structure of claim 3, wherein the layer of phase-change material forms the three-dimensional shape around the portion of the second dielectric material provides a uniform electrical contact resistance with the conductive liner along each side of the layer of the phase change material contacting the conductive liner.

7. The semiconductor structure of claim 3, wherein the first horizontal portion of the layer of phase-change material on the heater element and on the first portion of the first dielectric material provides a small volume of the phase-change material allowing the layer of phase-change material adjacent to the heater element to quickly attain a temperature for a phase transition of the phase-change material.

8. The semiconductor structure of claim 4, wherein the vertical edge of the first horizontal portion of the layer of phase-change material on the second portion of the first dielectric material abuts the vertical edge of the conductive liner on the first portion of the first dielectric material provides better electrical contact resistance than the electrical contact resistance of the phase-change material that has vertical edges that have been directionally etched.

9. The semiconductor structure of claim 2, wherein a width of a portion of the conductive material and the conductive liner that contacts a bottom surface of the top electrode is less than a width of the second dielectric material.

10. The semiconductor structure of claim 9, wherein the width of the portion of the conductive material and the conductive liner that contacts the bottom surface of the top electrode is the same width as the width of the first horizontal portion of the layer of phase-change material on the heater element and on the first portion of the first dielectric material.

11. The semiconductor structure of claim 1, wherein the conductive liner is composed of an electrically conductive material that does not react with the layer of phase-change material at elevated temperatures.

12. The semiconductor structure of claim 3, wherein the first horizontal portion of the layer of phase-change material on the heater element and on the first portion of the first dielectric material with a small volume of the layer of phase-change material requires less energy from the heater element in the first dielectric material to change an atomic structure of the phase-change material.

13. A semiconductor structure for a phase-change memory device, the semiconductor structure comprising:
a heater element in a first dielectric material, wherein the heater element is on a portion of a bottom electrode;
a resistive liner on the heater element and on a first portion of the first dielectric material;
a layer of phase-change material surrounds a portion of a second dielectric material, wherein the layer of phase-change material forms a three-dimensional shape around the portion of the second dielectric material; and
a conductive liner is under a first portion of the layer of phase-change material and surrounds a portion of a bottom surface of a hardmask layer and vertical portions of the hardmask layer.

14. The semiconductor structure of claim 13, further comprising:
a conductive material on a portion of a top surface of the second dielectric material and abuts vertical portions of the conductive liner on the vertical portions of the hardmask layer and a vertical portion of the layer of phase-change material that is under a portion of the conductive liner that surrounds the portion of the bottom surface of the hardmask layer, wherein the conductive material has a lower portion in a center portion of the conductive material; and
a top electrode is over at least exposed portion of the conductive material and the conductive liner.

15. The semiconductor structure of claim 13, wherein the layer of phase-change material surrounds the portion of the second dielectric material, further comprises:
a first horizontal portion of the layer of phase-change material is on the resistive liner;
a second horizontal portion of the layer of phase-change material is on the conductive liner on a second portion of the first dielectric material;
a third horizontal portion of the layer of phase-change material is under a portion of the conductive liner that is under the portion of the bottom surface of the hardmask layer; and
a vertical portion of the layer of phase-change material on a vertical portion of the conductive liner residing on a vertical side of a third dielectric material.

16. The semiconductor structure of claim 15, wherein the resistive liner is composed of a material with an electrical resistivity that is higher than the electrical resistivity of the phase-change material in a crystalline atomic structure and lower than the electrical resistivity of the phase-change material in an amorphous atomic structure.

17. A method of forming a semiconductor structure, the method comprising:
- depositing a layer of a first dielectric material above a bottom electrode;
- forming a heater element in the first dielectric material;
- depositing a second dielectric material over the heater element and the first dielectric material;
- depositing a hardmask material;
- removing a portion of the hardmask material and the second dielectric material stopping on a top surface of the heater element and the first dielectric material;
- performing a lateral etch of a portion of the second dielectric material to form a recess;
- conformally depositing a conductive liner;
- perform a directional etch removing exposed horizontal portions of the conductive liner;
- conformally depositing a layer of a phase-change material over exposed portions of the hardmask, the conductive liner, the first dielectric material, and the heater element;
- deposit a third dielectric material and perform a chemical-mechanical polish;
- directionally etching a top portion of the third dielectric material;
- isotropically etching an exposed portion of the phase-change material;
- deposit a conductive material and perform the chemical-mechanical polish; and
- form a top electrode.

18. The method of claim 17, wherein conformally depositing the layer of the phase-change material, further comprises:
- conformally depositing a layer of an electrically resistive material over the exposed portions of the hardmask, the conductive liner, the first dielectric material, and the heater element; and
- conformally depositing the phase-change material on the layer of the resistive material.

19. The method of claim 17, wherein the phase-change material is of one a doped phase-change material or an undoped phase-change material.

20. The method of claim 17, wherein a thickness of the layer of the phase-change material is between five and thirty nanometers.

* * * * *